(12) United States Patent
Liaw

(10) Patent No.: US 8,582,352 B2
(45) Date of Patent: Nov. 12, 2013

(54) METHODS AND APPARATUS FOR FINFET SRAM CELLS

(75) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 152 days.

(21) Appl. No.: 13/312,828

(22) Filed: Dec. 6, 2011

(65) Prior Publication Data

US 2013/0141963 A1    Jun. 6, 2013

(51) Int. Cl.
*G11C 11/00*    (2006.01)

(52) U.S. Cl.
USPC ............... 365/154; 365/156; 365/63; 365/51; 365/189.08; 365/206

(58) Field of Classification Search
USPC .............. 365/154, 156, 63, 51, 189.08, 206
See application file for complete search history.

(56) References Cited

U.S. PATENT DOCUMENTS

| | | | | |
|---|---|---|---|---|
| 6,924,560 B2 * | 8/2005 | Wang et al. | ...................... | 257/67 |
| 6,967,351 B2 * | 11/2005 | Fried et al. | ...................... | 257/74 |
| 7,164,175 B2 * | 1/2007 | Kawasaki et al. | ............. | 257/401 |
| 7,271,451 B2 * | 9/2007 | Liaw | .............................. | 257/369 |
| 7,348,284 B2 * | 3/2008 | Doyle et al. | ................... | 438/142 |
| 7,592,675 B2 * | 9/2009 | Liaw | .............................. | 257/371 |
| 7,812,373 B2 * | 10/2010 | Bauer et al. | ................... | 257/206 |
| 7,915,691 B2 * | 3/2011 | Wong et al. | ..................... | 257/392 |
| 7,994,583 B2 * | 8/2011 | Inaba | ............................ | 257/369 |
| 8,028,264 B2 * | 9/2011 | Shimada et al. | .............. | 716/122 |
| 8,059,452 B2 * | 11/2011 | Liaw | .............................. | 365/154 |
| 8,129,798 B2 * | 3/2012 | Inaba | ............................ | 257/392 |
| 8,144,868 B2 * | 3/2012 | Hauge et al. | ................... | 380/200 |
| 8,273,617 B2 * | 9/2012 | Thompson et al. | ........... | 438/197 |
| 8,315,084 B2 * | 11/2012 | Liaw et al. | ..................... | 365/154 |
| 8,391,093 B2 * | 3/2013 | Asayama | ................... | 365/210.1 |
| 8,399,931 B2 * | 3/2013 | Liaw et al. | ..................... | 257/369 |

* cited by examiner

*Primary Examiner* — Viet Q Nguyen
(74) *Attorney, Agent, or Firm* — Slater & Matsil, L.L.P.

(57) ABSTRACT

Methods and apparatus for providing finFET SRAM cells. An SRAM cell structure is provided including a central N-well region and a first and a second P-well region on opposing sides of the central N-well region, having an area ratio of the N-well region to the P-well regions between 80-120%, the SRAM cell structure further includes at least one p-type transistor formed in the N-well region and having a gate electrode comprising a gate and a gate dielectric over a p-type transistor active area in the N-well region; and at least one n-type transistor formed in each of the first and second P-well regions and each n-type transistor having a gate electrode comprising a gate and a gate dielectric over an n-type transistor active area in the respective P-well region. Methods for operating the SRAM cell structures are disclosed.

20 Claims, 18 Drawing Sheets

METHODS AND APPARATUS FOR FINFET SRAM CELLS

RELATED APPLICATIONS

This application is related to U.S. application Ser. No. 13/312,810, entitled "Methods and Apparatus for finFET SRAM Arrays in Integrated Circuits," filed Dec. 6, 2011; which is hereby incorporated in its entirety herein by reference.

BACKGROUND

Static random access memory ("SRAM") arrays are commonly used for storage on integrated circuit devices. As semiconductor processes advance, device sizes and power-supply levels both continue to fall. Falling device sizes results in reduced charge storage in the SRAM cells. The reduced charge storage results in increasing soft error rate ("SER"). SER is caused by alpha-particles and cosmic ray neurons that cause errors in stored bits. SER has become a major concern as SRAM cells are implemented in advanced semiconductor processes recently, because the SER, if uncorrected, leads to a failure rate that is higher than the failure rate for all other mechanisms, combined.

A circuit approach to reducing SER is to add on-chip error correction circuitry ("ECC"). While the ECC architectures can reduce the SER, these approaches increase chip size and decrease the speed of the SRAM accesses.

Recent advances in finFET transistor technology have made advanced SRAM cells using finFET transistors possible. In contrast to the prior planar MOS transistor, which has a channel formed at the surface of a semiconductor substrate, a finFET has a three dimensional channel region. In the finFET, the channel for the transistor is formed on the sides, and sometimes also the top, of a "fin" of semiconductor material. The gate, typically a polysilicon or metal gate, extends over the fin and a gate dielectric is disposed between the gate and the fin. The three-dimensional shape of the finFET channel region allows for an increased gate width without increased silicon area even as the overall scale of the devices is reduced with semiconductor process scaling; and in conjunction with a reduced gate length; providing a reasonable channel width characteristic at a low silicon area cost.

However, when an SRAM cell is formed using single fin finFET transistors for the pull up or "PU" transistors and also the pass gate "PG" transistors, both n-wells and p-wells are used. In a conventional SRAM cell with single fin finFET transistors, the p-well region is always larger than the n-well region by at least 20%. This is due to the n-type finFET transistors being at least twice the p-type finFET gate count. The collection area for alpha particles is high and this will lead to additional SER increases.

BRIEF DESCRIPTION OF THE FIGURES

For a more complete understanding of the present invention, and the advantages thereof, reference is now made to the following descriptions taken in conjunction with the accompanying drawings, in which.

Figure 1:
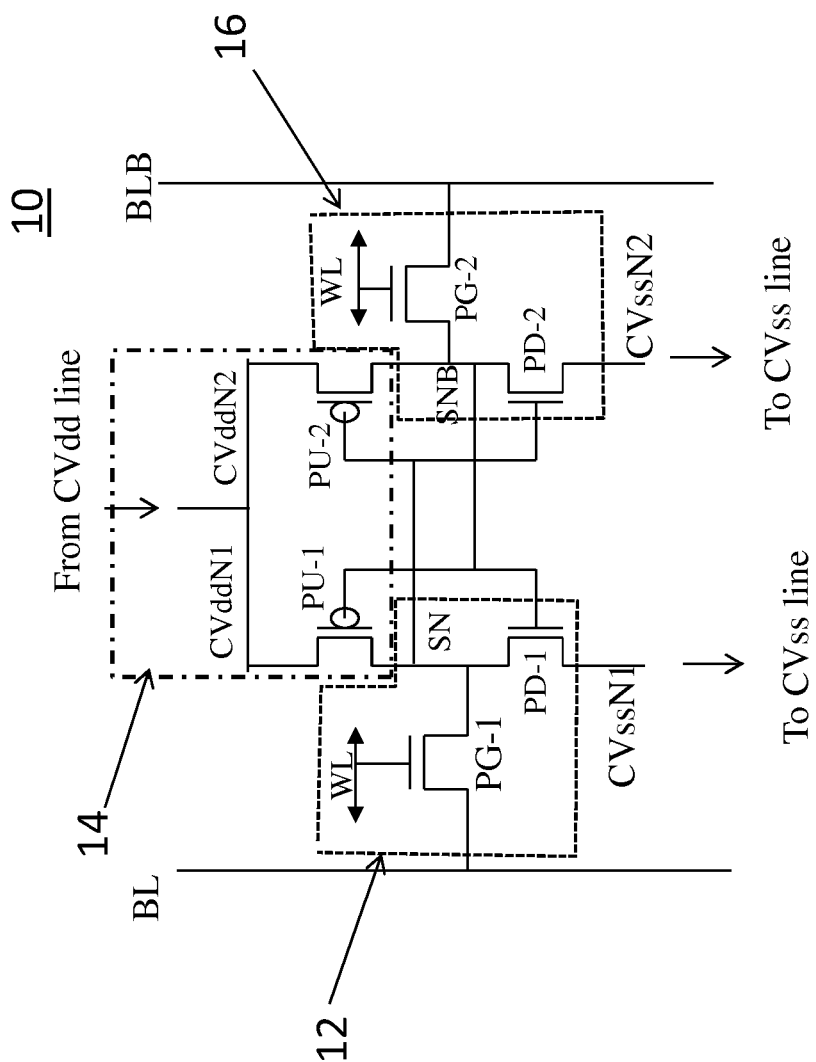
FIG. 1 depicts in a simplified circuit schematic an SRAM cell for use with the embodiments.

The drawings, schematics and diagrams are illustrative and not intended to be limiting, but are examples of embodiments of the invention, are simplified for explanatory purposes, and are not drawn to scale.

DETAILED DESCRIPTION

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed concepts of the application, and do not limit the scope of the disclosure and do not limit the scope of the appended claims.

Embodiments of the present application, examples of which are now described in detail, provide novel methods and apparatus for SRAM cells using finFET devices with improved SER immunity, and improved cell disturb immunity. The SRAM cells have a higher device width ratio of approximately 1 between p-type pull up and n-type pull down cell devices. N-well area and N-well space is enlarged and tightened which improves electron collection and increases SER immunity. The SRAM cell has improved read disturb immunity, while the cell devices remain compatible with low cost lithography equipment. The SRAM is thin in area and provides high density along with the SER immunity.

In an embodiment, a first type SRAM cell array is provided using single fin finFET transistors for all transistors within the cells. The SRAM cell has a central N-well and a first and a second P-well on either side of the N-well. The SRAM cell has a 6T cell structure formed of single fin finFET transistors. A pair of cross coupled inverters is provided coupled to store data on a true and a complementary storage node. Each of the cross coupled inverters has a p-type pull up transistor with a source terminal coupled to a cell positive voltage supply CVdd. The p-type pull up transistors are formed in the N-well and are single fin finFET transistors. The inverters each further include an n-type pull down transistor. The n-type pull down transistors are also single fin finFET transistors. Each pull down transistor has its source coupled to either the storage node or the complementary storage node and a drain coupled to a cell negative supply voltage CVss. Each n-type pull down transistor is formed over one of the P-wells. Pass gate transistors in the SRAM cell are coupled between a true and a complementary bit line node and the respective storage nodes. The pass gates are single fin finFET transistors each formed over one of the P-wells. The pass gates have a gate terminal coupled to a word line node. The SRAM cells have overlying conductor lines that provide the word line to the word line nodes, the CVdd voltage to the CVdd nodes, and the CVss voltage to the CVss nodes. The bit line and complementary bit line are also conductors lying over the cell and coupled to the bit line and bit line bar nodes.

FIG. 1 depicts in a simple circuit diagram a 6T SRAM cell 10 for use with the embodiments. In FIG. 1, the cell 10 stores data in true and complementary form on storage nodes labeled "SN" and "SNB". Bit lines (sometimes called "digit" lines) send and receive data from the SRAM cell in true and complementary form on the bit line, labeled "BL," and bit line bar, labeled "BLB". In an SRAM array using the 6T cells 10, the cells are arranged in rows and columns. The columns typically are formed by the bit line pairs, with the cells disposed between the respective bit line pairs. The pass gate transistors PG-1 and PG-2 provide access to the storage nodes of the SRAM cell during read and write operations, and couple the storage nodes to the bit lines responsive to a voltage on the word line "WL".

The storage portion of the SRAM circuit is formed of four transistors that make a cross coupled pair of CMOS inverters. Pull up transistor PU-1 and pull down transistor PD-1 form one inverter with an output at the storage node SN. Pull up transistor PU-2 and pull down transistor PD-2 form another inverter with the output at storage node SNB. The input of the first inverter is node SNB, coupled to the gates of the transistors PU-1 and PD-1, and the input of the second inverter is node SN, coupled to the gates of transistors PU-2 and PD-2. The pull up transistors PU-1 and PU-2 may be p-type transistors as shown; when the gate terminal of these p-type transistors is below a threshold voltage, these transistors will turn on and couple the positive cell voltage supply labeled "CVdd" to the respective storage node, thereby "pulling up" on the node at the output. The pull down transistors are typically n-type transistors and when the gate voltage exceeds a predetermined threshold voltage, the pull down transistors turn on and couple the respective storage node to the ground or Vss supply labeled "CVss" for "cell Vss". The voltage supplies will be coupled to the cell at the nodes labeled CVddN1, CVddN2, for CVdd, and CVssN1, CVssN2, for CVss.

The pull up transistors PU-1 and PU-2 are formed over the N-well region 14. The first pass gate PG-1 and the first pull down PD-1 are formed in the first P-well region, 12. The second pass gate PG-2 and the second pull down PD-2 are formed in the second P-well region, 16. In addition, the pull up transistors PU-1 and PU-2 have four terminals; a source, drain, gate and bulk terminal. The bulk terminal is the N-well and an electrical connection is made by one or more N-well contacts. As described further below, the N-well is connected to a positive voltage supply; in the embodiments this may be a positive voltage supply Vdd that is electrically isolated from the cell positive voltage supply CVdd.

In operation, if the pass gates PG1 and PG2 are inactive, the SRAM cell 10 will maintain the complementary values at the storage nodes SN and SNB indefinitely. This is so because each inverter of the pair of cross coupled inverters drives the input of the other, thereby maintaining the voltages at the storage nodes. This situation will remain stable until the power is removed from the SRAM, or, a write cycle is performed changing the stored data.

During a write cycle, the word line WL will become active (typically, a logic one or "high" voltage) and turn on the pass gates PG-1 and PG-2, coupling the storage nodes SN, SNB to the respective bit lines BL, BLB. If storage node SN is a "logic one" or high voltage, and the bit line voltage BL is a "zero", or low voltage, then the pass gate transistor PG-1 and the bit line BL will be discharging the storage node SN, in opposition to the action of the pull up transistor PU-1. Meanwhile, the complementary data on bit line BLB will necessarily be a "one" or high voltage, which will be coupled to the "low" voltage or "zero" stored at node SNB. Thus the pull down transistor PD-2 will be trying to pull down on the bit line BLB. As the storage node SNB rises, the pull up transistor PU-1 will cut off, and similarly, as the storage node SN value falls (due to the discharge through the pass gate PG-1), the pull down transistor PD-2 will cut off, similarly pull up transistor PU-1 will turn on and storage node SN will rise to a "one" or high voltage. So during write cycles, the pull up transistors PU-1 and PU-2 may be coupled so as to oppose the pass gate transistors PG-1 and PG-2 when the stored data switches, which is why the "alpha" ratio, the ratio of the current PUIon to the current PGIon is important for write access times. If the write data presented on the true and complementary bit line pair differs from the data already stored in the SRAM cell, the pass gates PG-1, PG2, must be able to overcome the "pull up" action of the transistors PU-1 and PU-2 during writes.

During a read cycle, the bit line and bit line bar BL, BLB may be placed at an intermediate voltage or a high voltage in a "precharge" operation. However during read cycles the bit lines are initially not actively driven. The word line WL then goes active to begin the read cycle, and couples the respective bit lines to the storage nodes SN and SNB. One of the two storage nodes will be a logic "zero" or low voltage, which means one of the pull down transistors PD-1 or PD-2 will be coupled to a bit line through the pass gates PG-1 or PG-2 and the pull down transistor will need to discharge that bit line in order to pull it down. So the drive strength of the pull down transistors affects read access time. In contrast, if the bit line is a precharged voltage which is a logic "one", and the corresponding stored value is a logic "one", the pull up transistor PU-1 or PU-2 that is coupled to that bit line only has to maintain the voltage on the bit line; so it can be seen that the drive strength of the pull up transistors is not as critical to the read access time.

Figure 2:
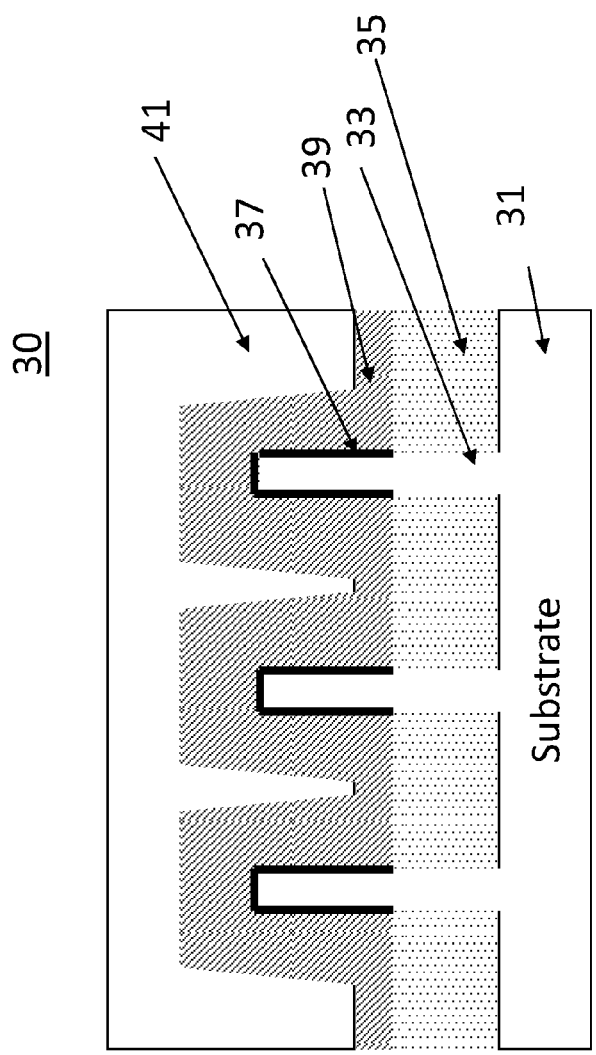
FIG. 2 depicts in a cross sectional view a bulk multiple fin finFET device for use with the embodiments.

FIG. 2 depicts in a cross-sectional view a multiple fin finFET device 30 that may be used with the embodiments. In FIG. 2, a semiconductor substrate 31 is shown. In this "bulk fin" arrangement, the fins 33 are formed of the semiconductor material. The fins 33 may be formed, for example, by photolithographic pattern and etch processes to remove semiconductor material from the substrate 31. A field oxide or other dielectric 35 is shown deposited on the substrate surface and extending partially up the sides of the fins 33. A gate dielectric 37 is shown formed on the vertical sides and the top of the fins 33. A gate 39 is shown deposited over the fins 33 and the gate dielectric 37. An active region is formed at the top surface, and along the vertical sides, of each of the fins 33. The common gate 39 extends over the three fins. If the three fins are further coupled together in parallel, a single finFET transistor may be formed; alternatively, three single fin finFET transistors having a common gate connection could be formed using the structure shown in FIG. 3. An interlevel dielectric material 41 is shown deposited over the gate material. The gate 39 may be doped polysilicon, for example. Silicide may be formed over the gate 39 to reduce resistance. Metal gate material may be used for gate 39 in place of or in combination with the polysilicon. The gate dielectric 37 may be an oxide, nitride, oxynitride, a nitrogen containing oxide layer, a hafnium containing oxide layer, a tantalum containing oxide layer, an aluminum containing oxide layer, or a high K dielectric material, where the dielectric content is greater than 10. In addition, the gate dielectric may also be one of $Ta_2O_5$, $Al_2O_3$, PEOX, TEOS, or a combination of any of these dielectrics. Multiple layers of dielectric material may be used for the gate dielectric, the field oxide, or the interlayer dielectric as is known. The fins 33 may be doped to form source and drain regions outside the channel areas covered by the gate 37 and thereby form FET transistors. Alternatively, the fins may form depletion mode transistors having uniformly doped fins.

Figure 3:
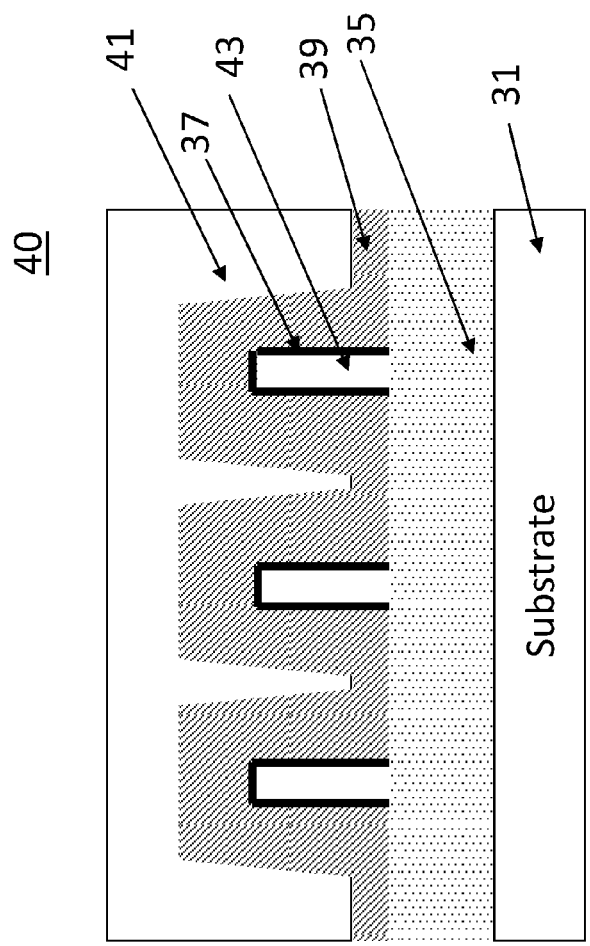
FIG. 3 depicts in a cross sectional view a silicon-on-insulator multiple fin finFET device for use with the embodiments.
Figure 4:
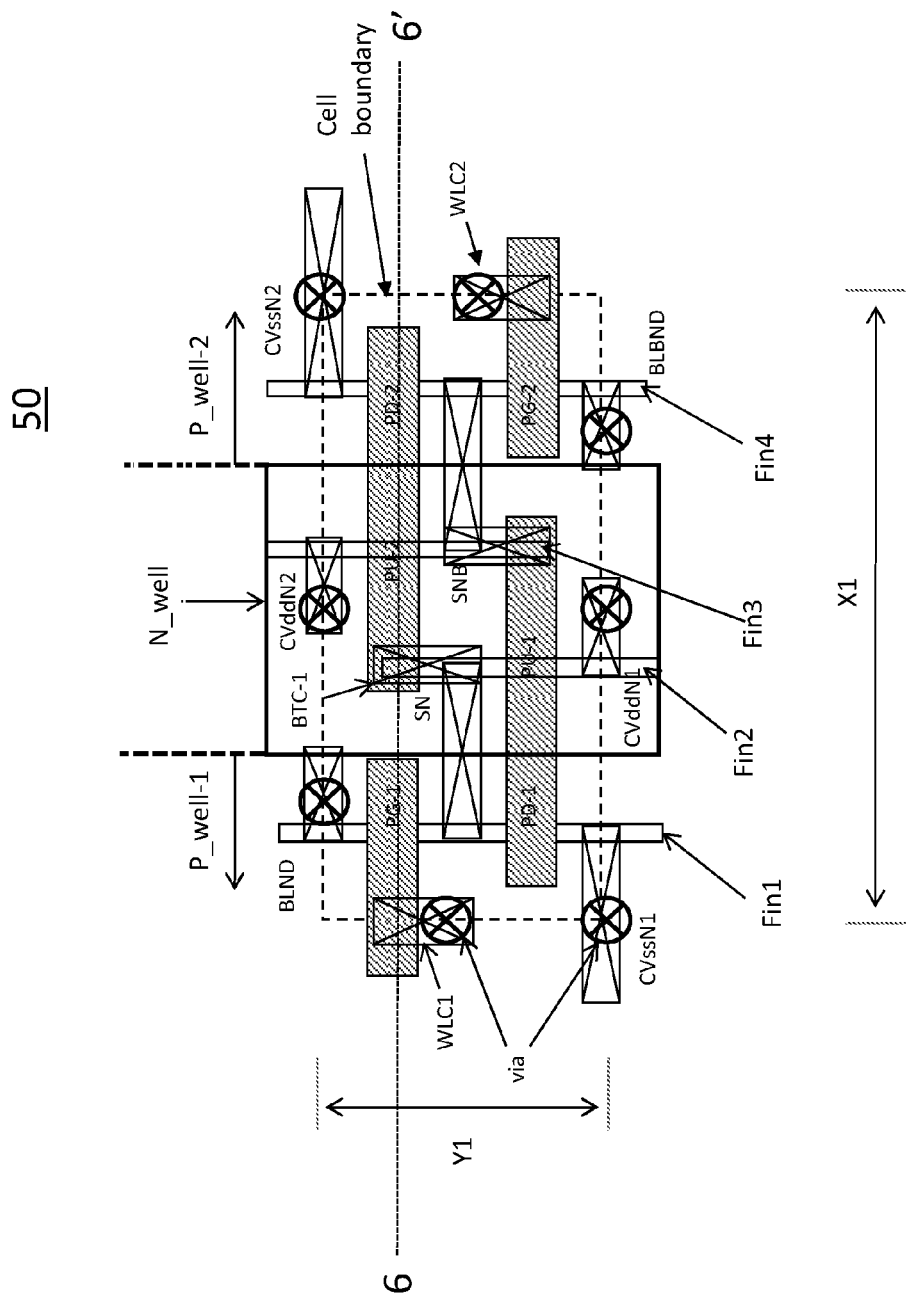
FIG. 4 depicts in a plan view a layout of an embodiment SRAM cell.

In an alternative embodiment, FIG. 3 depicts in a cross-sectional view a silicon-on-insulator or "SOI" embodiment finFET transistor 40. In FIG. 4, several elements are the same as in FIG. 2 and common reference numerals are used for those elements. Substrate 31 which may be a semiconductor substrate or other substrate including as non-limiting examples silicon, germanium, and the like, is shown with a field oxide or other insulator 35 deposited over it. Epitaxially grown fins 43 are shown formed on the surface of the insulator 35. The gate dielectric 37, gate 39, and interlevel dielectric 41 are disposed generally as in FIG. 3. The use of the SOI fins makes processing different for forming the fins 43, however the remaining elements may be formed in the same manner as for the embodiment of FIG. 2; and either the bulk fin or SOI fin approach may be used with the SRAM array cells described below.

Figure 5:
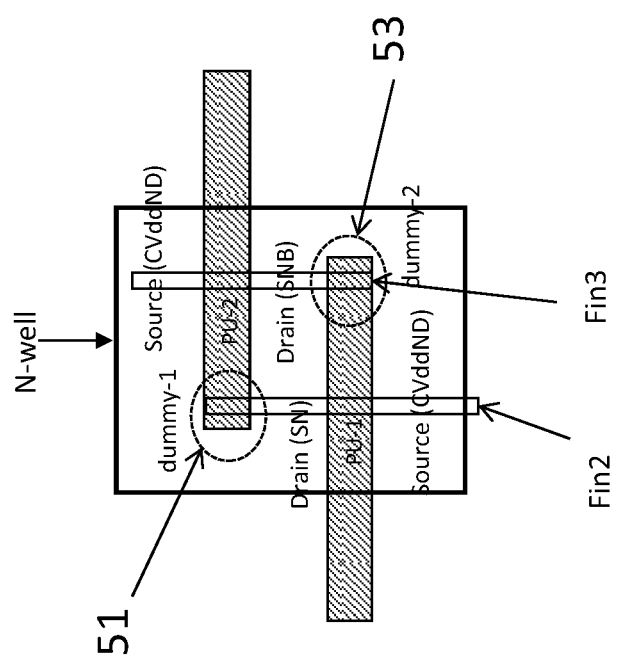
FIG. 5 depicts in a plan view a close up portion of the cell layout of FIG. 4.

FIG. 4 depicts in a plan view the layout of a first example embodiment SRAM cell 50. In FIG. 5, the local interconnects, fins, and wells are shown for a 6T SRAM cell using single fin finFET devices. The transistors are labeled as for FIG. 1 above, for example, PG-1, PU-2 etc. Fins are numbered Fin1, Fin2, Fin3, and Fin4 and are each a semiconductor fin. Fin1 and Fin4 are formed over P_well-1 and P_well-2. Fins 2 and 3 are formed over an N_well region to provide the semiconductor region for the p-type transistors PU-1, PU-2. The N_well region also provides a contact for the body or bulk terminal of the p-type transistors and in embodiments of the SRAM cells, may be coupled to different positive voltages to further enhance performance. The fins provide the channel, source and drain regions for n-type devices such as PD-1, and PG-1, for Fin1, and PD-2, PG-2, for Fin4. The gate material is shown for each transistor and where the gate overlies a fin, a transistor is formed. Thus in this orientation, which is for illustration and arbitrarily selected, PD-1 is formed over the lower portion of Fin1, and PG-2 is formed over the lower portion of Fin4.

The fins are also a connection point for upper level metal patterning (not shown in FIG. 5) to connect the SRAM cells to the bit lines, word lines, and cell power supplies CVdd and CVss. For example, the word line contacts WLC1 and WLC2 are labeled in the figure. The contacts, depicted as rectangular material with an X pattern, will extend vertically as metal or other conductor materials in an opening formed in a dielectric layer, and will provide a vertical connection to the overlying metal conductors. The contacts also provide local interconnection between elements, for example the lower portion of Fin3 is coupled to the lower portion of Fin4. Where needed, vias are also shown, depicted in FIG. 4 as circular shapes with an X in the center. The vias vertical provide connections between different metal layers, such as between metal-1 and metal-2. So the word line contact WLC1 is shown with an overlying via. Contacts also provide local interconnections, such as the contacts at the storage node SN, which couple the gate of PU-2, PD2 and the respective source/drain terminals of transistor PU-1 (Fin2) and PD-1 (Fin1) together. Fin1 couples the bit line node BLND to one source/drain of the pass gate transistor PG-1, the storage node SN is coupled to the other source/drain terminal, and so the voltage on a word line at WLC1 can couple these nodes together by turning on the pass gate transistor PG-1. Similarly, Fin4 provides the bit line bar node BLBND at one source/drain terminal of the pass gate transistor PG-2, and the word line contact WLC2 and its via provide connection to the word line, so that the word line voltage can turn on PG-2 to couple the BLBND to storage node SNB.

As devices get smaller, the capacitance available for SRAM storage may be reduced. In the embodiment of FIG. 5, the layout provides additional capacitance for the storage nodes SN and SNB. Fin2 is extended beyond the active region of PU-1 and extends underneath the gate material of PU-2. Similarly, Fin3 extends beyond the active region of PU-2 and underneath the gate material of PU-1. Each of the fins Fin2, Fin3 is also a portion of one of the storage nodes, SN, or SNB. Thus by extending the fins beyond the active area of the transistors and underneath the gate material, the capacitance for data storage in the SRAM cell increases.

The SRAM cell 50 has a central N_Well portion over which the fins Fin2 and Fin3 are formed. The Fin2 provides node CVddN1, as in FIG. 1, coupled to one terminal of the pull up transistor PU-1 by a contact and via. Fin2 also provides the storage node SN coupled to the other terminal of PU-1. Fin3 provides the node CVddN2 coupled to one terminal of the pull up transistor PU-2 such as shown in FIG. 1, and the other source/drain terminal is coupled to SNB, as in FIG. 1. Both PU2-1 and PU-2 are typically p-type transistors as shown in FIG. 1. The N_well may be connected to a voltage terminal to provide the bulk or body connection to the transistors formed on Fin2, and Fin3. For example, the N_well may be connected to a periphery Vdd power line, importantly this voltage is electrically isolated from the cell positive supply voltage CVdd. In other embodiments, the N_well may be coupled to the cell positive supply voltage CVdd.

The cell 50 has a pitch in the vertical or Y direction of Y1 and pitch in the horizontal or X direction of X1. The actual dimension of these pitches is determined by the design rules and scale of the semiconductor process being used. In certain embodiments, the ratio of X1 to Y1 may be greater than or equal to 2.

FIG. 5 illustrates a magnified view of the devices of FIG. 4 in the N-well region. In FIG. 5, the added capacitance for the storage node SN is in the area labeled 51, and the added capacitance for the storage node SNB is in the area labeled 53. Each of these regions is considered a "dummy" transistor, dummy-1 and dummy-2. Even though the gate material overlies the semiconductor fin at these locations, a transistor is not formed, but instead an added capacitance is formed between the fin, for example Fin2 or Fin3, and the gate, PU-2 or PU-1. The fin and the gate are separated by the gate dielectric material which acts as the capacitor dielectric.

Figure 6:
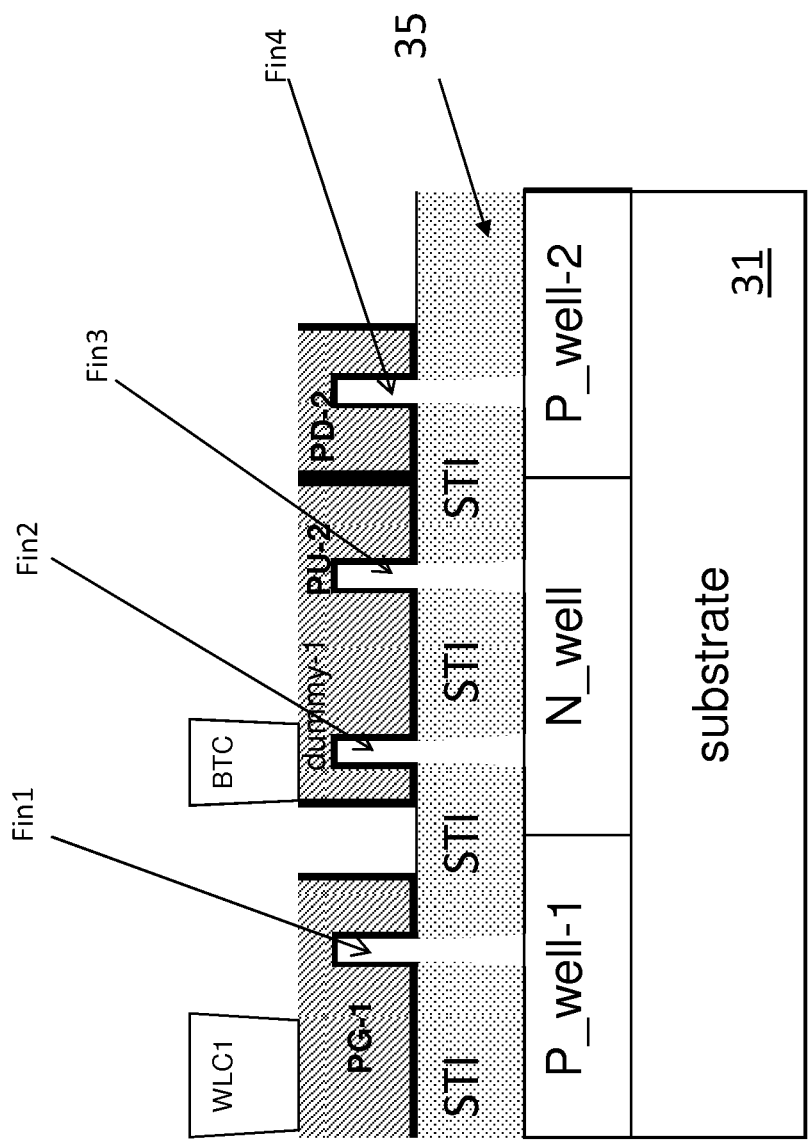
FIG. 6 depicts in a cross-sectional view a cross-section of the embodiment SRAM cell illustrated in FIG. 4.

FIG. 6 illustrates the cross section taken along the line 6-6' in FIG. 4. In FIG. 6, a substrate 31, which may be a silicon substrate, for example, is provided. The N-well is formed in a central location and the first and second P-wells are formed on either side of the N-well. In the illustrated embodiment bulk fins for the finFET devices are used. The fins, Fin1, Fin2, Fin3, and Fin4 extend through a dielectric layer 35, and a gate dielectric is formed over the fins. The gates for transistor PG-1 are shown overlying Fin1, for example, the gate for the pull up transistor PU-2 is shown overlying the active area of Fin3, while the same gate extends to cover the "dummy-1" portion of Fin2. The gate for the pull down transistor PD-2 is shown overlying Fin4 in the cross section. The word line contact WLC1 is shown over the gate for PG-1, while the butted contact BTC is shown over the gate for the added capacitance of dummy-1, as seen in FIG. 4, the cross section is taken through this contact.

Figure 7:
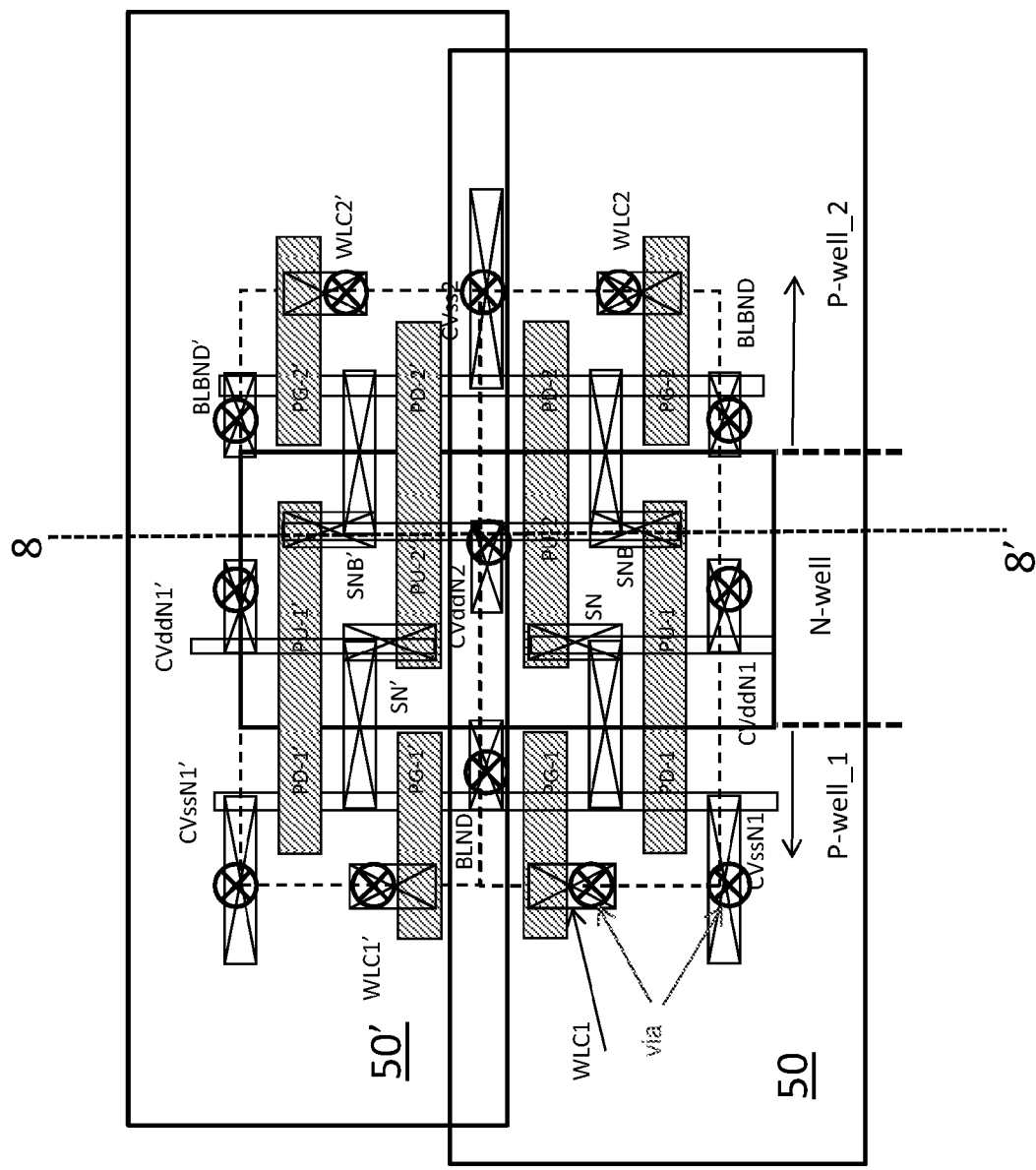
FIG. 7 depicts in a plan view a two cell layout using the SRAM cells of the embodiments.

FIG. 7 depicts a plan view of two of the SRAM cells 50 and 50' arranged in an example layout. As is known to those skilled in the art, when cells are arranged together to form an array, the cell layouts may be flipped or rotated to enable higher packing densities. Often by flipping the cell over a cell boundary or axis and placing the flipped cell adjacent the original cell, common nodes and connections can be combined to increase packing density. In FIG. 7 an example is shown. Cell 50 is shown exactly as in FIG. 4, above. Cell 50' is a duplicate cell but flipped over the X axis at the top of cell 50. The common features BLND, CVddN2, and CVssN2, are combined to save space. Thus the two cells pack into a space that is less than twice the cell boundary area. The N-wells are combined and extend in the Y direction, as do the P-wells. The word line contacts are arranged in a central portion of the cells and word lines can be arranged in rows in the X direction, while the P-well-1 has vias for coupling the cell negative voltage supply CVss to the nodes CVssN1, CVssN1'; similarly the node CVssN2 provides a place to couple the voltage supply to the devices in P-well 2. The cell positive voltage supply CVss can be coupled to the cells at the nodes CVssN1 and CVssN1'. The bit line may be coupled to both cells at the common node BLND at the boundary between the P-well_1 and the complementary bit line may be coupled to the cells using the nodes BLBND and BLBN' as shown.

Figure 8:
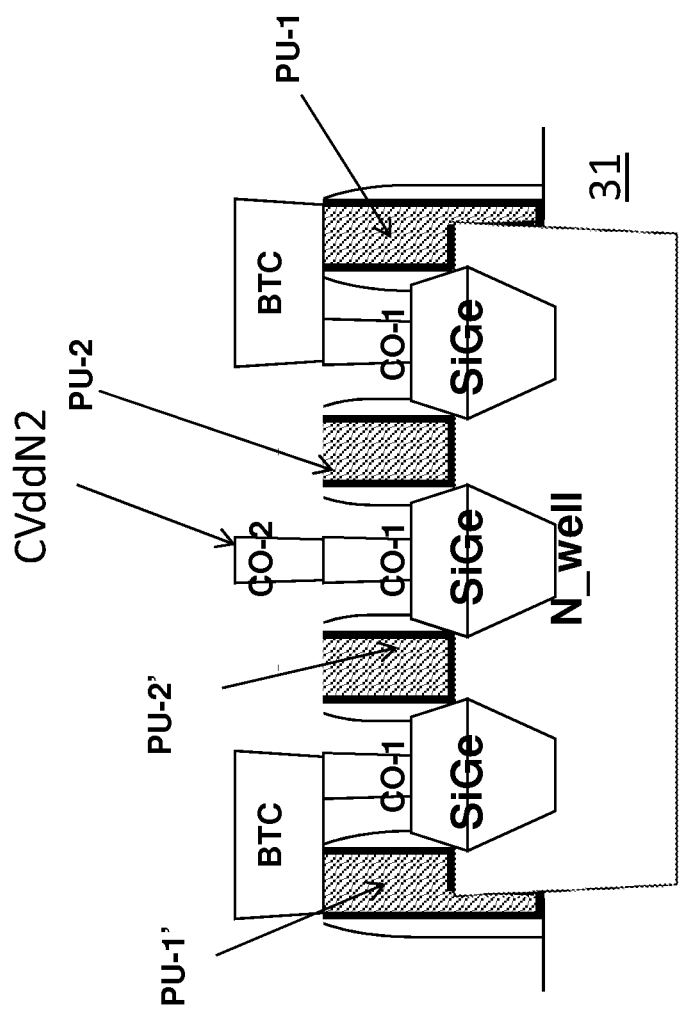
FIG. 8 depicts in a cross sectional view a cross section of the plan view of FIG. 6.

FIG. 8 illustrates in a cross sectional view the cross section taken along the line 8-8' in FIG. 7. In FIG. 8, starting at the right side and going to the left, the cross section shows the butted contact BTC overlying a portion of the gate for pull up transistor PU-1, the cross section continues through a semiconductor fin formed over the N-well and contacts are shown contacting Si—Ge regions formed in the N-well. The cross section continues and the gate for pull up transistor PU-2 is shown, then another contact for the node CVddN2, including a via portion, then the cross section cuts through the gate for the pull up transistor PU-2' in cell 50', and then thought the butted contact BTC in cell 140' which overlies the gate for the pull up transistor PU-1'.

Figure 9:
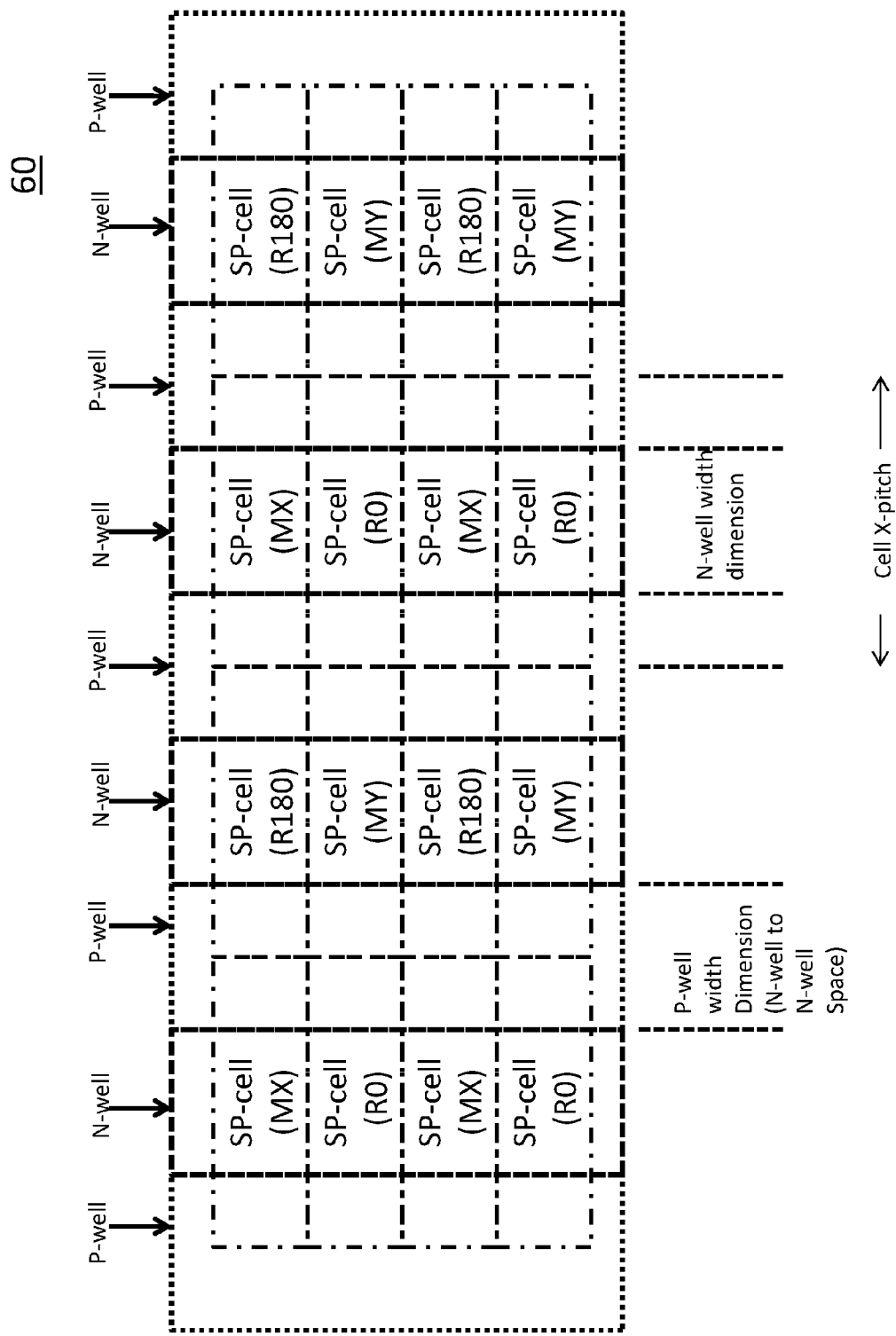
FIG. 9 depicts in a top view a diagram of a partial SRAM array using the embodiment SRAM cells to populate the SRAM array.

FIG. 9 illustrates in a plan view an example SRAM array 60 that is formed of single port SRAM cells such as the embodiment of FIG. 4, In order to increase the layout density, the cells are rotated or flipped to provide a highly dense SRAM array. The P-wells and N-wells are shown in columns with the ratio of the N-well area to the P-well area for any cell ranging between 80 to 20%, including the range 85-115%. The P-well dimension is then equal to the spacing from N-well to N-well, The cells may be rotated 0 or 180 degrees as indicated by the labels (R0) or (R180), or flipped over the X or Y boundaries as indicated by the labels (MX) or (MY) in the figure. The cell functions and the device sizes and relative positions are not affected by the layout flipping or rotation, but common elements along cell boundaries are sometimes combined to increase packing density, as shown above in FIG. 7.

In the embodiments of FIGS. 4, 5, and 7 the fins are shown having a common width. However, it is possible that some of the fins have different widths than others, for example the fins in the N-well regions could be wider than those in P-well regions. These modifications would provide additional alternative embodiments for each of the cells depicted above.

Figure 10:
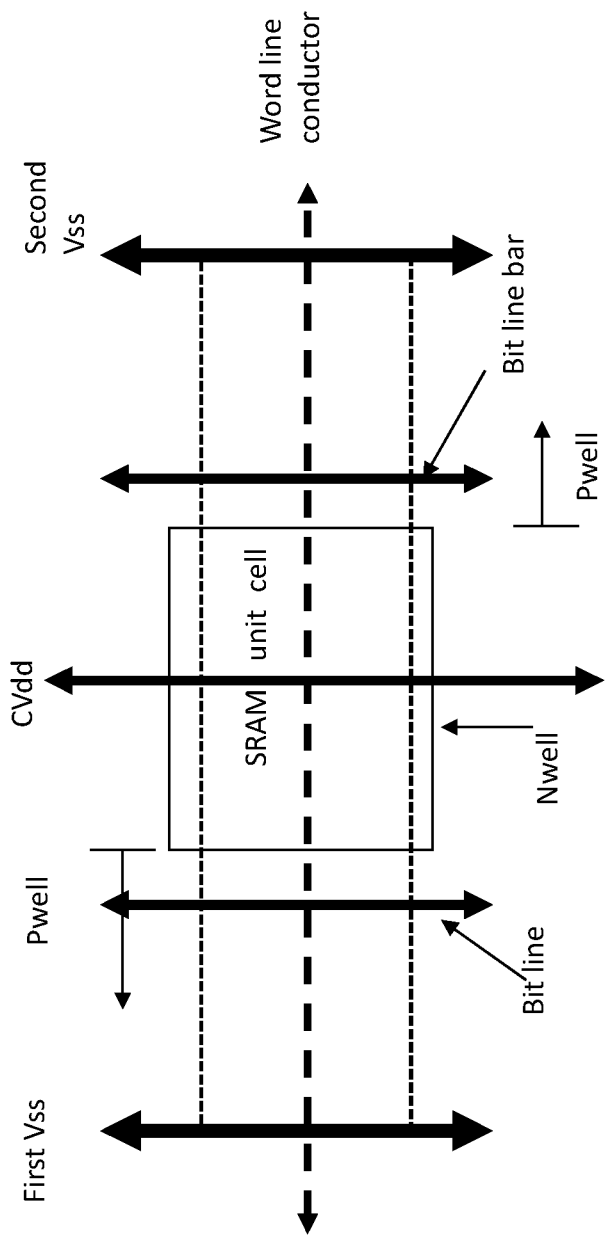
FIG. 10 depicts in a top view a wiring layout for use with the embodiments.

For clarity of illustration, the layout views of FIGS. 4, 5 and 7 depicting the various embodiments show the local interconnect, contacts, via and gate connections, but omit the metal layers. FIG. 10 depicts in a simple plan view one embodiment of the overlying metal pattern for the SRAM cells. In FIG. 9, the word line conductor, which may be a metal-1 or metal-2 conductor, is shown running across the middle of the cell in the X direction. Looking at the vias for the word line contacts in FIG. 4 or 7, it may be observed that the word line connections are generally arranged along a central portion of the cells from left to right. The bit line and bit line bar connections are arranged in parallel on opposite sides of the N-well and running in the Y direction. The cell positive power supply CVdd is arranged in the Y direction running centrally over the N-well. Again examining the layout views of FIGS. 5 and 6, for example, it can be observed that the nodes CVddN1 and CVddN2 and the associated vias are arranged in alignment for the vertical connections.

In the embodiment of FIG. 9, the first and second Vss lines are also shown arranged vertically, outside of the N-well and on opposite sides, and outside of the bit line pair. The nodes CVssN1 and CVssN2 in FIGS. 4, and 7, for example, illustrate where the contacts and vias for these connections are formed in each cell layout. The bit lines, CVdd, and first and second CVss lines are arranged in columns in the embodiment of FIG. 10. These conductors may be formed in metal 1, metal 2 or other metal layers, so long as they are electrically isolated from one another and from the word line conductor.

Figure 11:
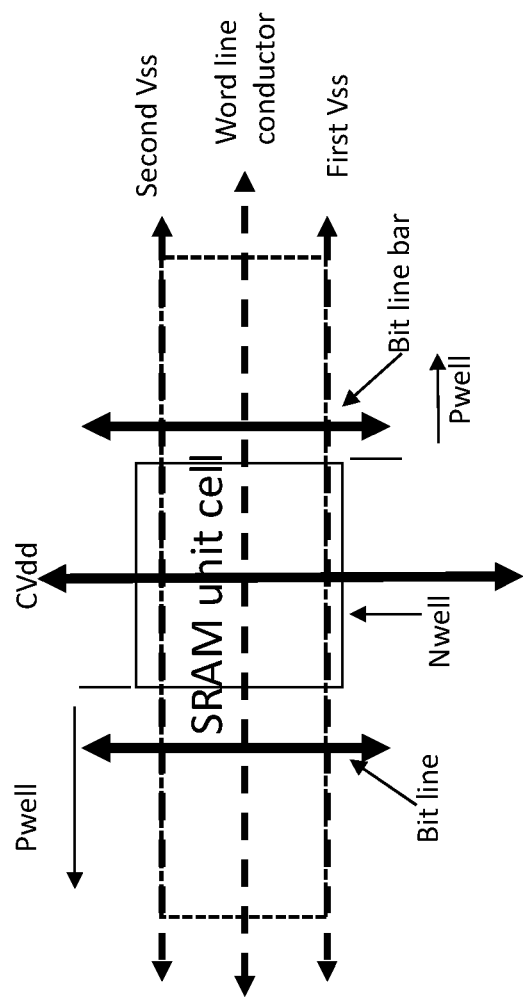
FIG. 11 depicts in a top view an alternative wiring layout for use with the embodiments.

FIG. 11 depicts in a plan view an alternative metal pattern that may be used to couple the SRAM cells of FIGS. 4, and 7 to the respective metal layer conductors. In FIG. 11, the word line conductors and the first and second Vss conductors are formed along the X direction or in rows; while the Vdd conductor CVdd and the bit line pair run in the Y direction and in parallel, or in columns. Again examining the contacts and vias shown in FIGS. 4 and 7, the alignment of the cell nodes to the various conductors can be easily observed.

The operation of the single fin finFET SRAM cell of the embodiments is further enhanced by use of a voltage control or "assist" circuit. This circuit is used to provide different voltages on the positive cell voltage supply CVdd for different operations. For the single fin finFET SRAM cells, a lowered CVdd voltage is used in the write cycle, while a voltage equal to or greater than the voltage on the word line is used in the read cycles. In some embodiments the voltage control circuit may be used to provide a lowered CVdd for standby mode. By reducing the voltage CVdd during writes, the write margin problems that occur when the pull up and pass gate devices are of similar dimensions can be addressed. Further, by increasing the CVdd voltage to the SRAM cells during reads, the speed of the read access to the cells can be increased.

Figure 12:
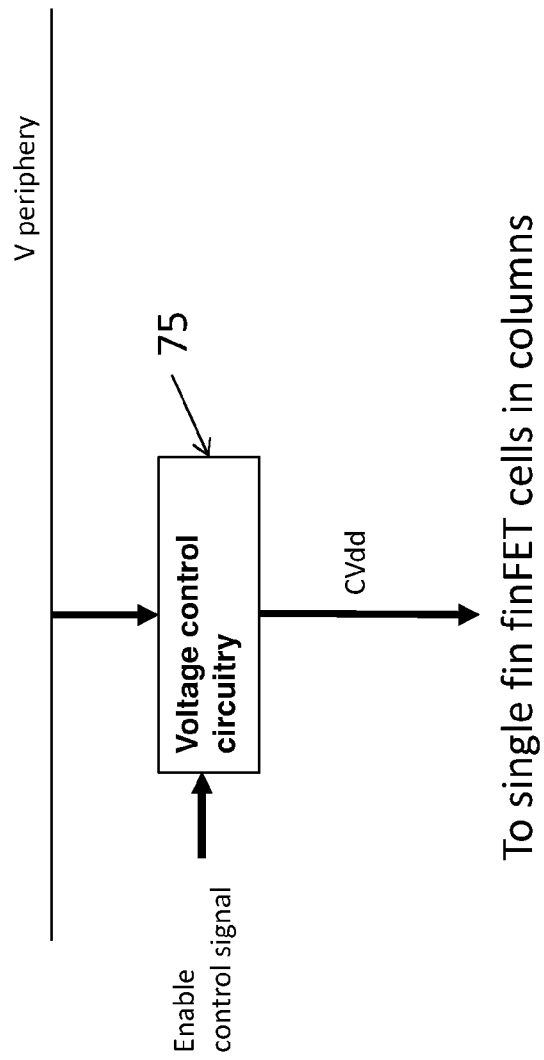
FIG. 12 depicts in a block diagram a voltage control circuit for use with the embodiments.

FIG. 12 depicts a column voltage control circuit 75; which may be provided for each column in an example SRAM array as further described below. The enable control signal may cause the voltage control circuitry 75 to output a voltage CVdd that is less than a voltage placed on the word lines V_WL during a write operation. Further, in other embodiments, the circuitry may also output a boosted or elevated voltage on CVdd during a read operation; alternatively the voltage CVdd may be approximately equal to the word line voltage in a read operation. Finally when the SRAM array is in a "standby" mode, the cell positive supply voltage CVdd may be substantially reduced from a nominal level by as much as 600 millivolts. This feature is especially significant when a system or integrated circuit containing the SRAM array is used in a battery powered device such as a cellphone, tablet, laptop, PDA, book reader, music or video player or the like.

Figure 13:
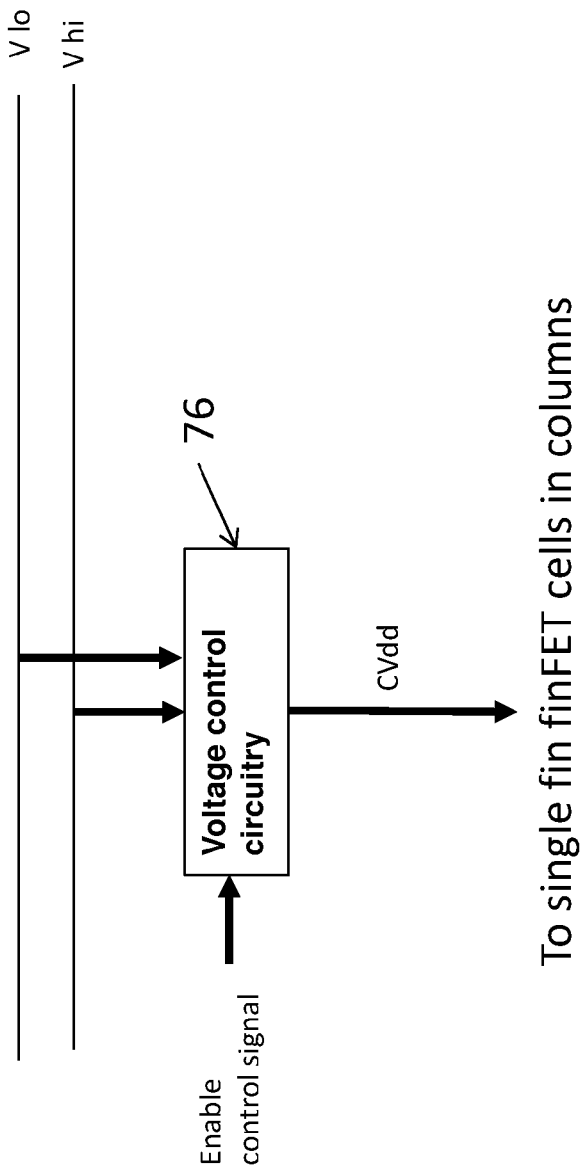
FIG. 13 depicts in a block diagram an alternative embodiment voltage control circuit.

FIG. 13 depicts a simple circuit diagram of an alternative voltage control circuit 76. In FIG. 13, instead of the voltage control circuit creating a reduced voltage for writes and an increased voltage for reads, the input Vdd voltages include a "hi" and "lo" voltage. The voltage control circuitry 76 then selects between them, based on control input signals, and outputs a selected voltage to the CVdd of the cells. Again, as indicated in Table 1, the cell positive voltage CVdd may be reduced during writes and standby operations, and increased during reads, to enhance the read access times of the single fin embodiment SRAM cells.

Figure 14:
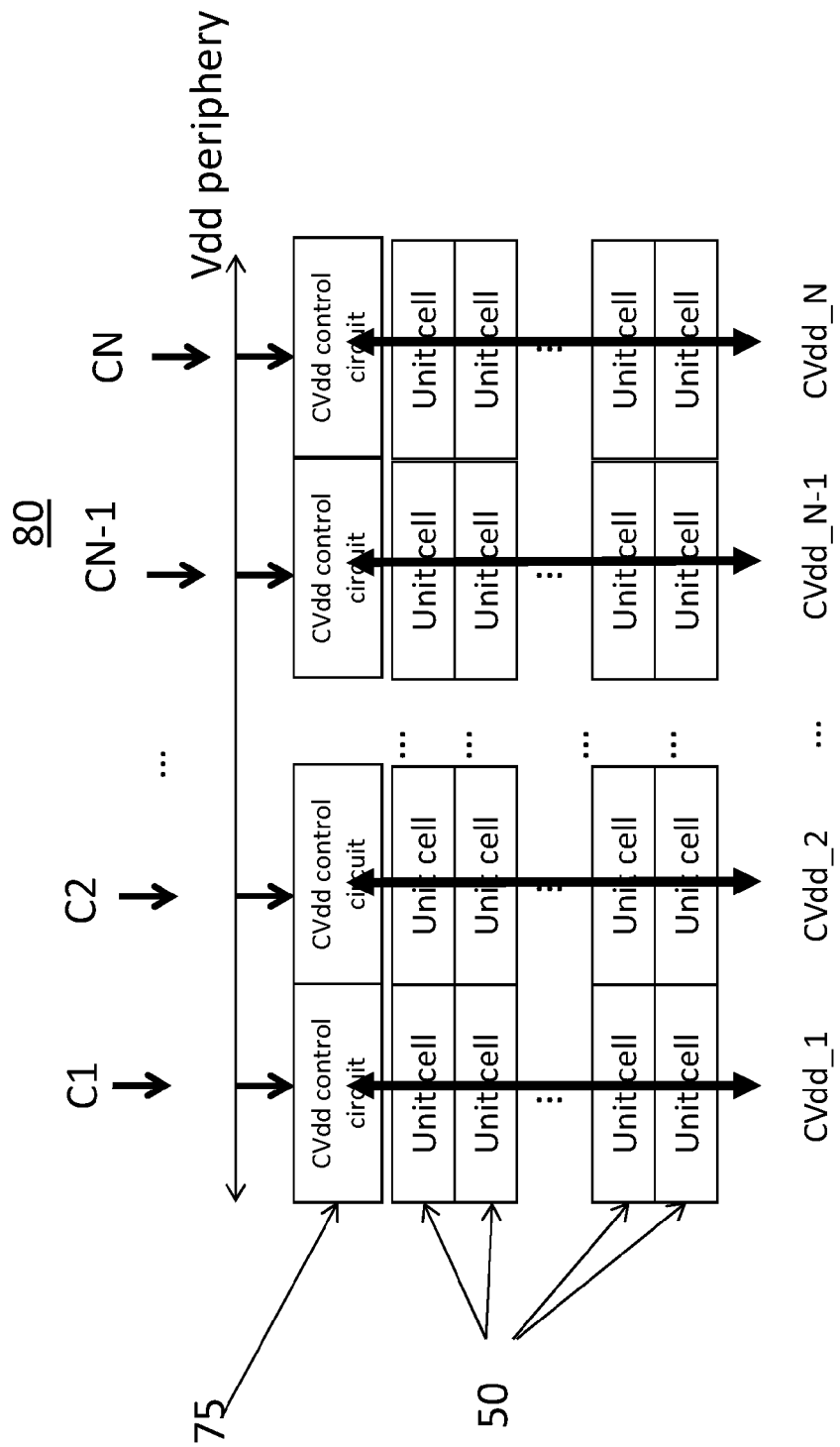
FIG. 14 depicts in a block diagram an SRAM array embodiment.

FIG. 14 depicts an embodiment SRAM array 80 using the finFET cells 50 of FIG. 4, for example, to form the array. The SRAM cells 50 are arranged in columns labeled C1-CN. Each column of cells has a cell CVdd line labeled CVDD_1-CVdd N. The unit cells are arranged in rows and word lines (not shown for clarity) will run along each row of cells. In a given cycle, for example a read cycle, a row of cells may be selected by a voltage on the word line, and the stored data will be output on bit line pairs (also not shown in this figure) for each column.

Each column of cells C1-Cn has a voltage control circuit 75. The input in this example embodiment is a single Vdd voltage, such as Vdd periphery. Alternatively, the voltage control circuits could be those depicted in FIG. 12, for example, and receive a high and low Vdd voltage input. The output is the cell CVdd for each column.

Figure 15:
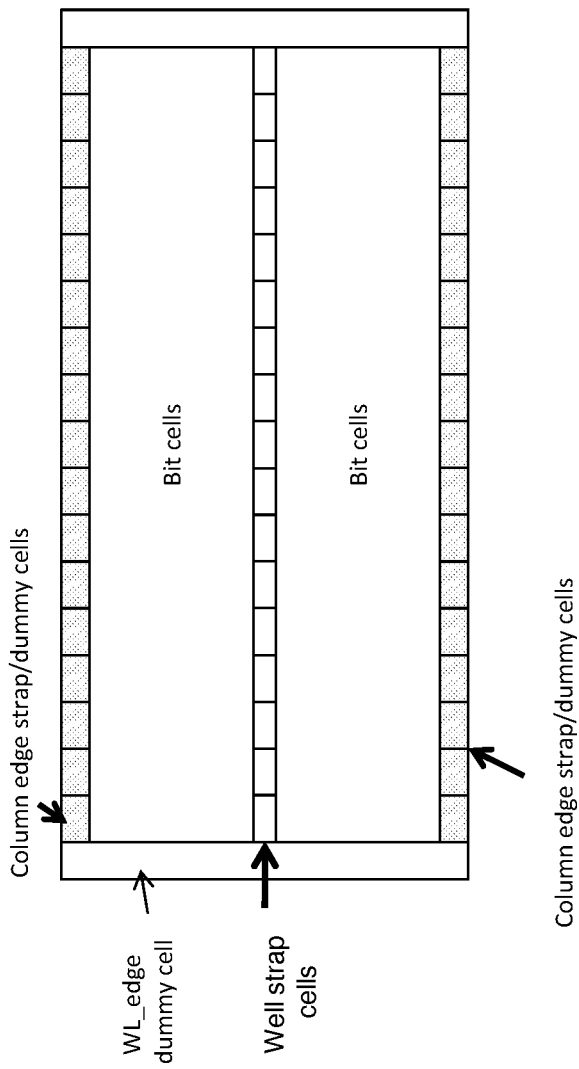
FIG. 15 depicts in a plan view cell layout for an SRAM array embodiment.

FIG. 15 depicts in another plan view the layout for an SRAM array 85 using the SRAM cells of the embodiments. In FIG. 15, the SRAM array includes a row of cells labeled "Well strap cells". These cells do not store data but instead provide connections between the N and P-wells to supply the bulk terminal voltages as needed. Similarly, the edges of the SRAM array 85 include column edge strap/dummy cells, which provide connections to the voltage supplies Vdd and Vss. Also as shown the array includes WL_edge dummy cells, which provide connections to the word lines and may include driver circuitry for the word lines.

Figure 16:
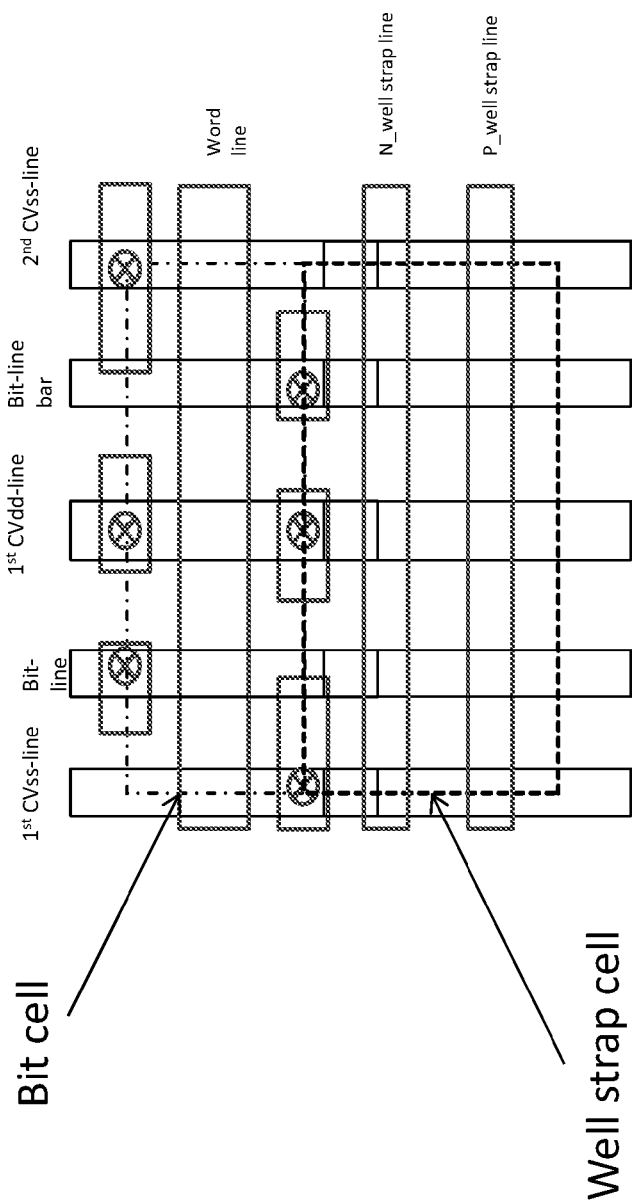
FIG. 16 depicts in a plan view the layout for the well strap cells of FIG. 14.

FIG. 16 illustrates in a plan view the layout of a single well strap cell as used in the array 85 in FIG. 15. In FIG. 16, a bit cell is shown above the well strap cell. The bit cell may be, for example, the single fin embodiment SRAM cell 50 of FIG. 4. In the column conductors, which may for example a metal layer such as metal-2, there is on the left side a first CVss line, then the bit line, the CVdd line running through the central portion of the bit cell, the bit line bar line, and then the second CVss line. In the rows the word line is running horizontally across the bit cell, the word line may be a metal-1 conductor, for example, separated by interlevel dielectric from the column conductors. Other metal levels could also be used.

In the well strap cell, conductors are shown arranged in rows and may be used for coupling the N-well strap line, for example, to the a Vdd line outside the array such as Vdd periphery. The P-well strap line also runs horizontally and may be coupled to the P-wells and to a Vss line. For the single fin finFET SRAM cell embodiment the N-wells are to be isolated from CVdd and the N-well straps are to be tied to Vdd from the periphery or another source and be electrically isolated from CVdd.

Figure 17:
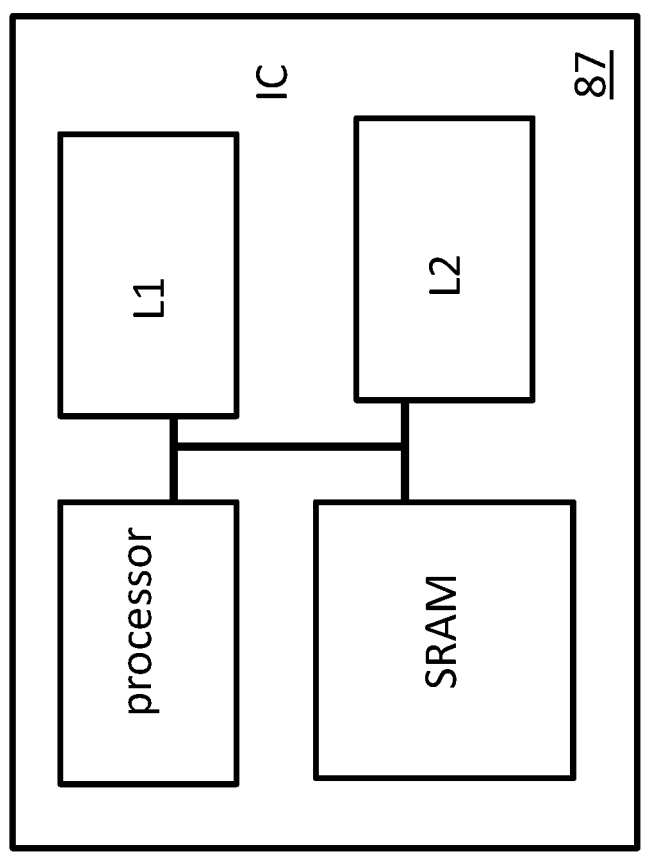
FIG. 17 depicts in a block diagram an integrated circuit embodiment.

FIG. 17 depicts in a block diagram an embodiment integrated circuit with a core processor coupled to three SRAM arrays configured as a level 1 cache L1, a level 2 cache L2, and a general use memory labeled SRAM. The core processor could be a microprocessor, a reduced instruction set computer ("RISC") core, a licensed core such as an ARM core, a digital signal processor ("DSP") or the like. The single fin finFET SRAM cells of FIG. 4, for example, may be used to form the memory SRAM on the integrated circuit 87. For this type of SRAM array, the density (data bits per area) is of prime importance. For the caches L1 and L2, SRAM cells of FIG. 4 may be used, or alternatively other SRAM cells such as multiple fin finFET cells could be used.

Figure 18:
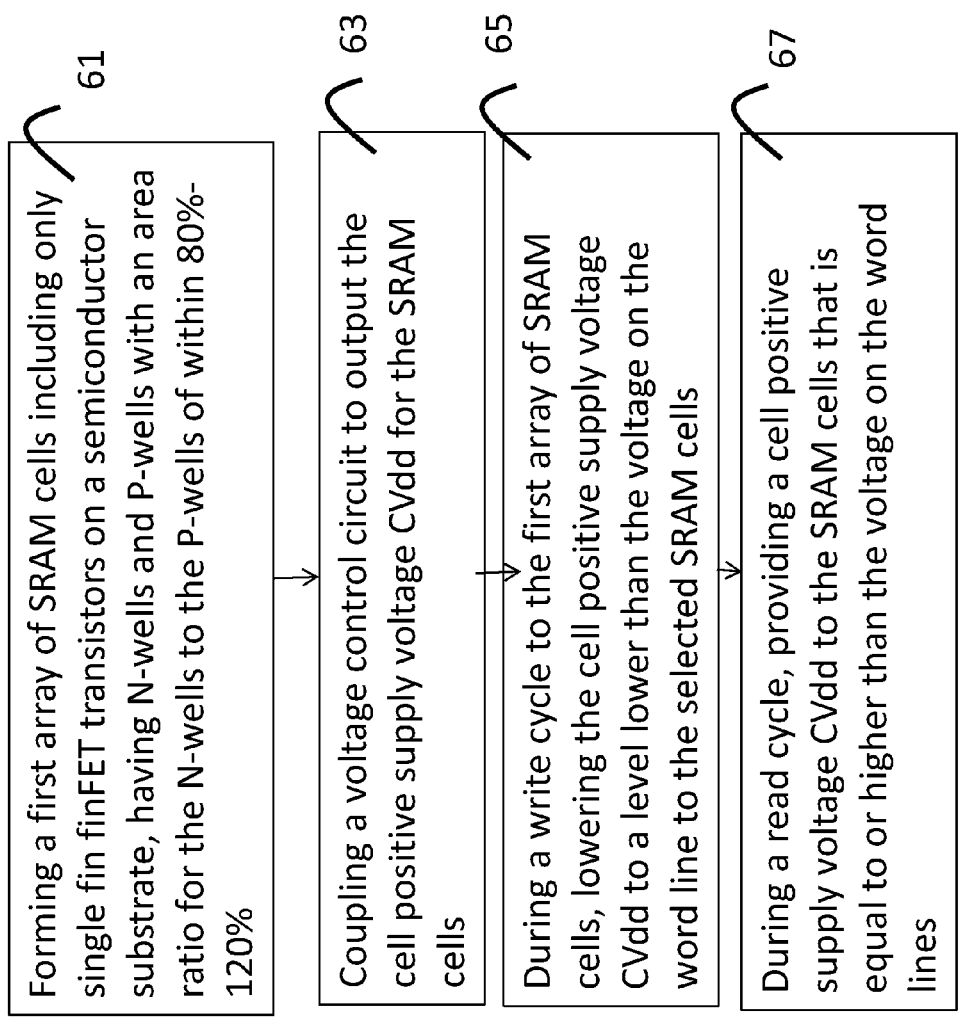
FIG. 18 depicts in a flow diagram a method embodiment.

FIG. 18 depicts in an example method embodiment a flow diagram. In step 61, a first array of SRAM cells of single fin finFET transistors is formed on a semiconductor substrate, the cells having N-wells and P-wells and an area ratio of N-well area to P-well area of within 80-120%. In step 63, a voltage control circuit is provided to output the cell positive voltage supply CVdd to the cells. In step 65, during a write cycle, the CVdd voltage to the cells is lowered to a voltage less than the voltage on the word lines of the selected cells; and in step 67, during a read cycle, increasing or maintaining the cell positive voltage supply CVdd to the SRAM cells to a voltage equal to or greater than the voltage on the word lines. By varying the cell supply voltage to the smaller SRAM cells having only single fin finFET transistors, the write margins and read access times may be improved. Use of the embodiments of the present application make providing both high density and SER immune SRAM arrays on a single integrated circuit in a single manufacturing process straightforward.

In an example embodiment, an SRAM cell structure is provided. The cell is formed of one N-well and two P-wells, with the N-well located between the two P-wells. The total area ratio of the N-well to the P-well is between 80% and 120%. The N-well area is therefore enlarged as compared to the conventional SRAM cells. The N-well contains at least one p-type finFET transistor, which may be a pull up transistor, and each P-well contains at least one n-type finFET transistor, which may be a pull down transistor or a pass gate transistor. The finFET transistors each have a channel region formed on a semiconductor fin. The finFET transistors have a gate overlying the semiconductor fin. A gate dielectric overlies the semiconductor fin between the semiconductor fin and the gate material.

In another embodiment, the SRAM cells each include a pair of cross coupled inverter devices. The cross coupled inverters are arranged to store data on a true storage node and a complementary storage node. Each of the inverters includes a p-type pull up transistor and an n-type pull down transistor formed of a single fin finFET transistor. Each of the SRAM cells has a first and a second n-type pass gate coupled between a true and a complementary bit line and the respective storage node. The pull up transistors are formed in the N-well region. The first inverter pull down transistor and the first pass gate are formed in the first P-well region; while the second inverter pull down transistor and the second pass gate are formed in the second P-well region. The pull up transistors of the cross coupled inverters each couple a cell positive voltage supply CVdd to the respective one of the true and complementary storage nodes. Similarly the pull down transistors of the inverters couple a cell negative voltage supply CVss to the respective one of the true and complementary storage nodes. The SRAM cells receive a CVdd line, a first and second CVss line, a bit line and bit line bar line, and a word line.

In an additional embodiment, the SRAM cells are arranged so that the total area ratio of the N-well to the P-wells is within the range of 90% to 110%. The CVdd line overlies the P-well area of the SRAM cells. The first CVss line overlies the first P-well region and the second CVss line overlies the second P-well region. The longitudinal axes of each of the CVdd line, the CVss line, the bit lines, are placed in parallel to each other.

In another embodiment, the SRAM cells receive the CVdd voltage from the output of a voltage control circuitry. The voltage control circuitry has an input coupled to a Vdd periphery voltage, and an enable input. The voltage control circuitry enable input has a read state indicating a read cycle and write state indicating a write cycle. In a read cycle, the voltage control circuitry outputs a CVdd voltage to the SRAM cells that is substantially equal to, or greater than, the voltage input to the voltage control circuitry. In a write cycle, the voltage control outputs a CVdd voltage that is lowered from the Vdd input to the voltage control circuitry.

In yet another embodiment, an SRAM cell is formed as described above comprising an N-well region centrally positioned between two P-well regions, the area ratio of the N-well to the P-well regions being between 80-120%. In addition a deep N layer may be formed beneath the N-well region and the two P-well regions and encloses the N-well and the two P-well regions.

In another embodiment, an SRAM cell structure is provided. In the SRAM cell structure, each SRAM cell includes an N-well and two P-wells, with the N-well centrally located between the two P-wells. The total area ratio of the N-well to the two P-wells is within the range of 85-115%. Each SRAM cell includes two inverters that are cross coupled to store data at a storage node and a complementary storage node. Each of the inverters is formed of a first p-type pull up transistor that is a single fin finFET formed over the N-well region, and each inverter also includes an n-type pull down transistor that is a single fin finFET formed over one of the two P-well regions. The SRAM cell further includes two pass gates that are n-type transistors, each another single fin finFET and each pass gate formed over one of the two P-well regions. In this embodiment of the SRAM cell structure, the dimensions of the pull up p-type transistors and the pull down n-type transistors are substantially the same.

In further embodiments, the SRAM cell structure includes conductor lines overlying the cells for supplying the cell positive supply voltage CVdd, positioned over the N-well. Further conductor lines are provided overlying the cell for supplying the cell negative voltage supply CVss, in an embodiment there are two CVss lines, one overlying each of the two P-well regions, and in parallel to one another and to the CVdd line. In additional embodiments the pass gates couple the true and complementary storage nodes of the SRAM cell to a true and complementary bit line node, for sending and receiving data to and from the SRAM cell. A pair of bit line conductor lines is also provided overlying the cells and in parallel to the CVdd and CVss conductor lines, the bit line conductors are also parallel to one another. The bit line conductors are coupled to the bit line nodes of the SRAM cells.

In a further embodiment, the SRAM cell structure is provided and the cell positive voltage supply CVdd is provided by a voltage control circuit. The voltage control circuit has a voltage input Vdd, an enable input, and outputs the CVdd voltage. In an embodiment the voltage control circuit enable line has different state indicating a write cycle and a read cycle. The voltage output on the CVdd for a read cycle is equal to or higher than the input voltage to the voltage control circuit. For a write cycle, the voltage output on the CVdd line is lower than the voltage input to the voltage control circuit.

The SRAM cell may include a deep N-well layer that lies beneath the P-well regions and the N-well region and encompasses the SRAM cell.

In another embodiment, an SRAM cell structure is provided using single fin finFET transistors. In the SRAM cell structure, a pair of inverters is cross coupled to store data at a storage node and a complementary storage node. A pair of bit lines, a true bit line and a complementary bit line, are coupled to the SRAM storage nodes by a first pass gate and a second pass gate responsive to a voltage on a word line. The SRAM cell structure includes a central N-well region and first and second P-well regions. The pass gates are n-type finFET transistors having single fins and formed over the first and second P-well regions. The SRAM cell structure includes for each of the cross coupled inverters a p-type pull up transistor which is a single fin finFET coupled between a cell positive voltage supply node for receiving a voltage CVdd, and one of the storage nodes. Each of the cross coupled inverters also includes a n-type pull down transistor, which is a single fin finFET device formed over one of the first and second P-well regions and coupled between one of the storage nodes and a node for receiving a cell negative supply voltage CVss.

In the SRAM cell structure of this embodiment, the available capacitance for the storage node and the complementary storage node are increased by extending the fin portion of active region of each of the pull up transistors, which are p-type single fin finFETs formed over the N-well region, underneath the gate portion of the other of the p-type pull up transistors. The interface material between the extended fin region of the pull up transistors and the gate portion of the other pull up transistor in the N-well is a dielectric material. The gate dielectric material may be an oxide, nitride, oxynitride, a nitrogen containing oxide layer, a hafnium containing oxide layer, a tantalum containing oxide layer, an aluminum containing oxide layer, a high K dielectric material, where the dielectric constant K is greater than 10. In addition the gate dielectric may also be one of $Ta_2O_5$, $Al_2O_3$, PEOX, TEOS, or a combination of any of these dielectrics. In a further embodiment, the SRAM cell structure is arranged such that in the same unit cell, the true and complementary bit lines are shielded from one another by a CVdd conductor line. The bit lines between adjacent SRAM cells of the embodiments used to form an array of SRAM cells are shielded one from another by a Vss conductor.

In another embodiment, an SRAM array is provided on an integrated circuit, The SRAM array includes a plurality of SRAM cells arranged in rows and columns. Each column of cells has a voltage control circuit that receives a Vdd input voltage such as Vdd periphery and outputs a CVdd voltage on a conductor line overlying the SRAM cells. In the SRAM cell structure, each of the SRAM cells includes an N-well and two P-wells, with the N-well centrally located between the two P-wells. The total area ratio of the N-well to the two P-wells is within the range of 85-115%. The SRAM cells each include two inverters that are cross coupled to store data at a data node and a complementary data node. Each of the inverters is formed of a first p-type pull up transistor that is a single fin finFET formed over the N-well region, and each inverter also includes an n-type pull down transistor that is a single fin finFET formed over one of the two P-well regions. The SRAM cells further each include two pass gates that are n-type transistors, each another single fin finFET and each pass gate formed over one of the two P-well regions. In this embodiment of the SRAM cell, the dimensions of the pull up p-type transistors and the pull down n-type transistors are substantially the same.

In additional further embodiments, the SRAM cells of the SRAM array each include conductor lines overlying the cells for supplying the cell positive voltage supply CVdd, positioned over the N-well regions. Further conductor lines are provided overlying the cell for supplying the cell negative voltage supply CVss, in an embodiment there are two CVss lines overlying each column of cells, one overlying each of the two P-well regions, and in parallel to one another and to the CVdd conductors. In additional embodiments of the SRAM cells, the two pass gates couple the true and complementary storage nodes of the SRAM cell to a true and complimentary bit line node for sending and receiving data to and from the SRAM cell. A pair of bit line conductor lines are also provided overlying the column of cells and in parallel to the CVdd and CVss conductor lines, the bit line conductors are also parallel to one another. A word line conductor is formed over each of the SRAM cells and is coupled to the pass gate transistors of each of the SRAM cells.

In a further embodiment of the SRAM array, the SRAM cells each receive the cell positive voltage supply CVdd from a voltage control circuit for each column. The voltage control circuit has a voltage input Vdd, an enable input, and outputs the CVdd voltage. In an embodiment the voltage control circuit enable line has different states indicating a write cycle and a read cycle. The voltage output on the CVdd for a read cycle is equal to or higher than the input voltage to the voltage control circuit. For a write cycle, the voltage output of the CVdd line is lower than the voltage input to the voltage control circuit. The SRAM cell may include a deep N-well layer that lies beneath the P-well regions and the N-well region and encloses the SRAM cell.

In the SRAM array, the SRAM cells include N-well and P-well regions and the total area ratio of the N-well region to the P-well regions is between 90 to 110%. In additional embodiments, the SRAM cells include pull up devices which are single fin finFET transistors formed in the N-well regions include gate, source, drain and bulk terminals. The SRAM array may include N-well strap cells for connecting an N-well metal line through contacts or vias to electrically control the N-well voltage. The N-well metal lines may be electrically isolated from the CVdd voltage for the cells, and may be connected to a predetermined positive voltage supply such as Vdd periphery.

In additional embodiments of the SRAM array, the SRAM cells have increased capacitance at the storage node and the complementary storage node, this is provided by extending the active portion of the fin for each of the two p-type pull up transistors in the N-well region to lie underneath the gate conductor of the other p-type pull up transistor.

In the SRAM cell embodiments above, in a further additional embodiment, the SRAM cells each have a short pitch distance Y1 and a longer pitch distance X1. In additional embodiments the ratio of X1 to Y1 may be greater than about 2.

In another embodiment, an integrated circuit includes at least a first single port SRAM array of SRAM cells having a first cell size. Each of the first cell size SRAM cells is formed of a 6T SRAM cell, having a pair of cross coupled inverters coupled to store data on a storage node and a complementary storage node; and each cell is further coupled to a bit line pair of a true and a complementary bit line by pass gates responsive to a voltage on a word line. Each of the transistors in the first cell size SRAM cells is a single fin finFET transistor. Each of the cross coupled inverters of the first cell size SRAM cells includes a p-type pull up transistor coupled between one of the true and complement storage nodes and a cell positive voltage supply CVdd. The SRAM cells in the first SRAM array are arranged in rows and columns. Each column of cells in the first SRAM array includes a voltage control circuit for outputting the cell positive voltage supply CVdd.

In the integrated circuit embodiment described above, the voltage control circuit has two states, one for a read cycle and one for a write cycle. In an additional embodiment, during a read cycle the voltage output on the cell positive voltage supply CVdd will be approximately equal to the word line voltage. During a write cycle, in another embodiment, the cell positive voltage supply CVdd will be lower than the voltage on the word lines by between 50 to 400 millivolts.

In another embodiment, an integrated circuit is provided including a processor and at least a first single port SRAM array formed entirely of single fin finFET transistors, each SRAM cell of the array having a central N-well region and a first and a second P-well region, the area ratio of the N-well region to the total area of the P-well regions being between 85-115%.

In a method embodiment, a first array of SRAM cells each formed of single fin finFET transistors is provided in an integrated circuit, the SRAM cells each having an N-well and tow P-well regions, and the area ratio of the N-well to the P-wells is between 80-120%. A voltage control circuit is provided and outputs a cell positive voltage supply CVdd to the SRAM cells. During a write cycle, the voltage control circuit lowers the CVdd voltage to the cells to a voltage that is less than the Vdd input voltage to the voltage control circuit. During a read cycle, the voltage control circuit maintains the voltage CVdd at the same voltage as the input voltage, or increases the voltage CVdd to a voltage greater than the input voltage.

The scope of the present application is not intended to be limited to the particular illustrative embodiments of the structures, methods and steps described in the specification. As one of ordinary skill in the art will readily appreciate from the disclosure of the example embodiments, processes, or steps, presently existing or later to be developed, that perform substantially the same function or achieve substantially the same result as the corresponding embodiments described herein may be utilized and these alternatives are contemplated as part of the embodiments. Accordingly, the appended claims are intended to include within their scope such processes or steps.

What is claimed is:

1. An SRAM cell structure, comprising:
a central N-well region and a first and a second P-well region on opposing sides of the central N-well region, having an area ratio of the N-well region to the P-well regions between 80-120%, the SRAM cell structure further comprising:
at least one p-type transistor formed in the N-well region and having a gate electrode comprising a gate and a gate dielectric over a p-type transistor active area in the N-well region; and
at least one n-type transistor formed in each of the first and second P-well regions and each n-type transistor having a gate electrode comprising a gate and a gate dielectric over an n-type transistor active area in the respective P-well region.

2. The SRAM cell structure of claim 1, and further comprising:
two cross coupled inverters coupled to store data on a true and a complementary data storage node, each of the cross coupled inverters further comprising a p-type pull up transistor that is a single fin finFET and an n-type pull down transistor that is a single fin finFET;

a pair of pass gate transistors having a word line coupled to a gate terminal, each of the pass gate transistors coupled between a respective one of a pair of true and complementary bit line nodes and one of the true and complementary storage nodes, each of the pass gate transistors being a single fin finFET formed in one of the P-well regions;

a cell positive voltage supply CVdd node coupled to a source terminal of each of the pull up transistors and to a CVdd line overlying the cell in the N-well region; and first and second cell negative supply voltage nodes CVss coupled to a first and a second CVss line overlying the cell in each of the P-well regions, the CVss lines being in parallel with the CVdd line;

each of the pull up transistors formed in the N-well region and each of the pull down transistors formed in a respective one of the first and second P-well regions.

3. The SRAM cell structure of claim 2 and further comprising the ratio of the N-well area to the P-well area being 90-110%.

4. The SRAM cell structure of claim 2 and further comprising a pair of bit lines coupled to the true and complementary bit line nodes, each bit line of the pair of bit lines positioned along boundaries formed between the N-well region and the first and second P-well regions.

5. The SRAM cell structure of claim 2 and further comprising:
a voltage control circuit having a Vdd input, an enable input, and an output for supplying the CVdd voltage on the CVdd line to the SRAM cell;
wherein the enable input has two states, a first state indicating a write cycle and a second state indicating a read cycle.

6. The SRAM cell structure of claim 5, wherein during the write cycle, the voltage control circuit outputs a CVdd voltage that is lower than the Vdd input to the voltage control circuit.

7. The SRAM cell structure of claim 6, wherein the voltage control circuit outputs a CVdd voltage between 50 and 400 millivolts lower than the voltage on the Vdd input.

8. The SRAM cell structure of claim 5, wherein during the read cycle, the voltage control circuit outputs a CVdd voltage that is equal to or greater than the Vdd input to the voltage control circuit.

9. The SRAM cell structure of claim 1, and further comprising a deep N layer underlying the N-well region and the P-well region and enclosing the SRAM cell structure.

10. An integrated circuit having an SRAM array, comprising:
a plurality of SRAM cells arranged in rows and columns, each of the plurality of SRAM cells further comprising:
an N-well region and a first and a second P-well region, and having an area ratio of the N-well region to the P-well regions being between 85-115%;
a pair of cross coupled inverters coupled to store data on a true storage node and a complementary storage node, each of the cross coupled inverters further comprising a p-type pull up transistor that is a single fin finFET formed over the N-well region, and an n-type pull down transistor that is a single fin finFET formed over a respective one of the first and second P-well regions;
a pair of pass gates coupled each coupled between one of a pair of true and complementary bit line nodes and the respective one of the true and complementary storage nodes, each of the pass gates comprising a single fin finFET transistor formed over a respective one of the first and second P-well regions, and each having a word line coupled to a gate terminal; and
a cell positive voltage supply CVdd node coupled to a source terminal of each of the pull up transistors;
wherein the pull up transistors in the SRAM cell further comprise a drain, a gate and a bulk terminal, and the fin that forms the drain of each of the pull up transistors also forms one of the true and complementary storage nodes and each fin of a one of the pull up transistors further extends under a gate electrode of the other pull up transistor.

11. The integrated circuit of claim 10 and further comprising:
a CVdd line overlying each column of SRAM cells;
a pair of bit line conductors overlying each of the columns of SRAM cells; and
a first and a second cell negative supply voltage CVss line overlying each of the columns of SRAM cells;
wherein the CVdd line is coupled to the CVdd node of the SRAM cells, the bit line conductors each couple to a respective one of the true and the complementary bit line nodes of the SRAM cells, and the first and the second CVss lines each couple to one of the pull down transistors in each P-well region of each of the SRAM cells, and the CVdd line, the CVss lines, and the bit line conductors are arranged in parallel with one another and with the columns of cells.

12. The integrated circuit of claim 11, wherein the CVdd lines overlie the N-well regions of each of the SRAM cells in the column of cells, and the first and second CVss lines overlie the first and second P-well regions in each SRAM cell in the columns of cells.

13. The integrated circuit of claim 10, wherein gate dimensions of the p-type pull up transistors and the n-type pull down transistors in the SRAM cells are approximately equal.

14. The integrated circuit of claim 11 wherein for each column of SRAM cells in the array of SRAM cells, a voltage control circuit is disposed with an output coupled to the CVdd line for the column of SRAM cells, and having an input coupled to a Vdd supply voltage, and having an enable input, the enable input having a first state indicating a read cycle and a second state indicating a write cycle.

15. The integrated circuit of claim 14, wherein during a write cycle, the voltage control circuits output a voltage on the CVdd line that is lower than the Vdd supply voltage and wherein during a read cycle, the voltage control circuits output a voltage on the CVdd line that is equal to or greater than the Vdd supply voltage.

16. The integrated circuit of claim 10, and further comprising well strap cells disposed in the SRAM array, each well strap cell further comprising an N-well strap line for coupling a positive Vdd voltage to a doped N region in the N-wells of the columns of the SRAM cells.

17. A method, comprising:
forming an array of SRAM cells comprised of only single fin finFET transistors on a semiconductor substrate, each of the SRAM cells having a central N-well region and a first and a second P-well region formed on opposing sides of the central N-well region, and a ratio of the N-well region area to the total P-well region area being between 80-120%, the array of SRAM cells arranged in rows and columns; and
coupling a voltage control circuit to each column of SRAM cells to provide a cell positive voltage supply CVdd on a CVdd line overlying the column of cells, wherein the voltage control circuit has a Vdd supply input, and an enable input, the enable input having a first state indicating a read cycle and a second state indicating a write cycle.

18. The method of claim 17, wherein providing the array of SRAM cells further comprises, for each of the SRAM cells:
providing a pair of cross coupled inverters coupled to store data on a true and a complementary data storage node, each of the cross coupled inverters having a p-type pull up transistor that is a single fin finFET formed over the N-well region, each of the cross coupled inverter having a n-type pull down transistor formed over one of the first and the second P-well regions, the n-type pull down transistors being a single fin finFET transistor; and
coupling a pair of pass gates between one of a true and a complementary bit line node, each pass gate coupled to the respective one of the true and the complementary storage nodes, and each pass gate having a gate terminal coupled to a word line, the pair of pass gates each being an n-type single fin finFET transistor formed over a respective one of the first and the second P-well regions.

19. The method of claim 17, and further comprising:
during a write cycle, providing a CVdd voltage on the CVdd line that is lower than the Vdd voltage supply input to the voltage control circuit.

20. The method of claim 17, and further comprising:
during a read cycle, providing a CVdd voltage on the CVdd line that is substantially equal to or greater than the Vdd voltage supply input to the voltage control circuit.

* * * * *